(12) United States Patent
Novotny et al.

(10) Patent No.: US 9,029,773 B2
(45) Date of Patent: May 12, 2015

(54) SEALED INFRARED IMAGERS

(71) Applicants: Vlad Joseph Novotny, Los Gatos, CA (US); Howard Woo, San Jose, CA (US)

(72) Inventors: Vlad Joseph Novotny, Los Gatos, CA (US); Howard Woo, San Jose, CA (US)

(73) Assignees: Vlad Novotny, Los Gatos, CA (US); Howard Woo, San Jose, CA (US)

( * ) Notice: Subject to any disclaimer, the term of this patent is extended or adjusted under 35 U.S.C. 154(b) by 6 days.

(21) Appl. No.: 13/775,217

(22) Filed: Feb. 24, 2013

(65) Prior Publication Data

US 2014/0239179 A1    Aug. 28, 2014

(51) Int. Cl.
    *G01J 5/02*     (2006.01)
    *G01J 5/20*     (2006.01)
    *H01L 31/09*     (2006.01)
    *H01L 31/18*     (2006.01)

(52) U.S. Cl.
    CPC . *G01J 5/20* (2013.01); *H01L 31/09* (2013.01); *H01L 31/18* (2013.01)

(58) Field of Classification Search
    CPC .... G02B 5/003; H01L 27/14649; G02J 5/045
    USPC ........................................... 250/338.1–338.5
    See application file for complete search history.

(56) References Cited

U.S. PATENT DOCUMENTS

| | | | | |
|---|---|---|---|---|
| 5,493,177 | A * | 2/1996 | Muller et al. | 313/578 |
| 5,777,328 | A * | 7/1998 | Gooch | 250/338.4 |
| 5,921,461 | A * | 7/1999 | Kennedy et al. | 228/124.6 |
| 7,177,516 | B1 * | 2/2007 | Ahn | 385/131 |
| 2004/0092041 | A1 * | 5/2004 | Ouvrier-Buffet et al. | 438/14 |
| 2004/0165080 | A1 * | 8/2004 | Burks et al. | 348/222.1 |
| 2005/0158914 | A1 * | 7/2005 | Amiotti | 438/115 |
| 2005/0218523 | A1 * | 10/2005 | Dubin | 257/762 |
| 2006/0081983 | A1 * | 4/2006 | Humpston et al. | 257/738 |
| 2007/0262407 | A1 * | 11/2007 | Schimert et al. | 257/432 |
| 2009/0218492 | A1 * | 9/2009 | Kierse et al. | 250/338.4 |
| 2010/0314544 | A1 * | 12/2010 | Ouvrier-Buffet | 250/338.4 |
| 2011/0303847 | A1 * | 12/2011 | Kurashina et al. | 250/338.4 |
| 2012/0235045 | A1 * | 9/2012 | Kurashina et al. | 250/353 |

* cited by examiner

*Primary Examiner* — Kiho Kim

(57) ABSTRACT

The architecture, design and fabrication of array of suspended micro-elements with individual seals are described. Read out integrated circuit is integrated monolithically with the suspended elements for low parasitics and high signal to noise ratio detection of changes of their electrical resistance. Array of individually sealed, suspended micro-elements is combined with signal processing chip that contains nonvolatile memory with sensitivity calibration of all elements and interpolation between non-functional elements. When the micro-elements are infrared light absorbers, image analysis and recognition is embedded in the processing chip to form the infrared imaging solution for infrared cameras.

8 Claims, 11 Drawing Sheets

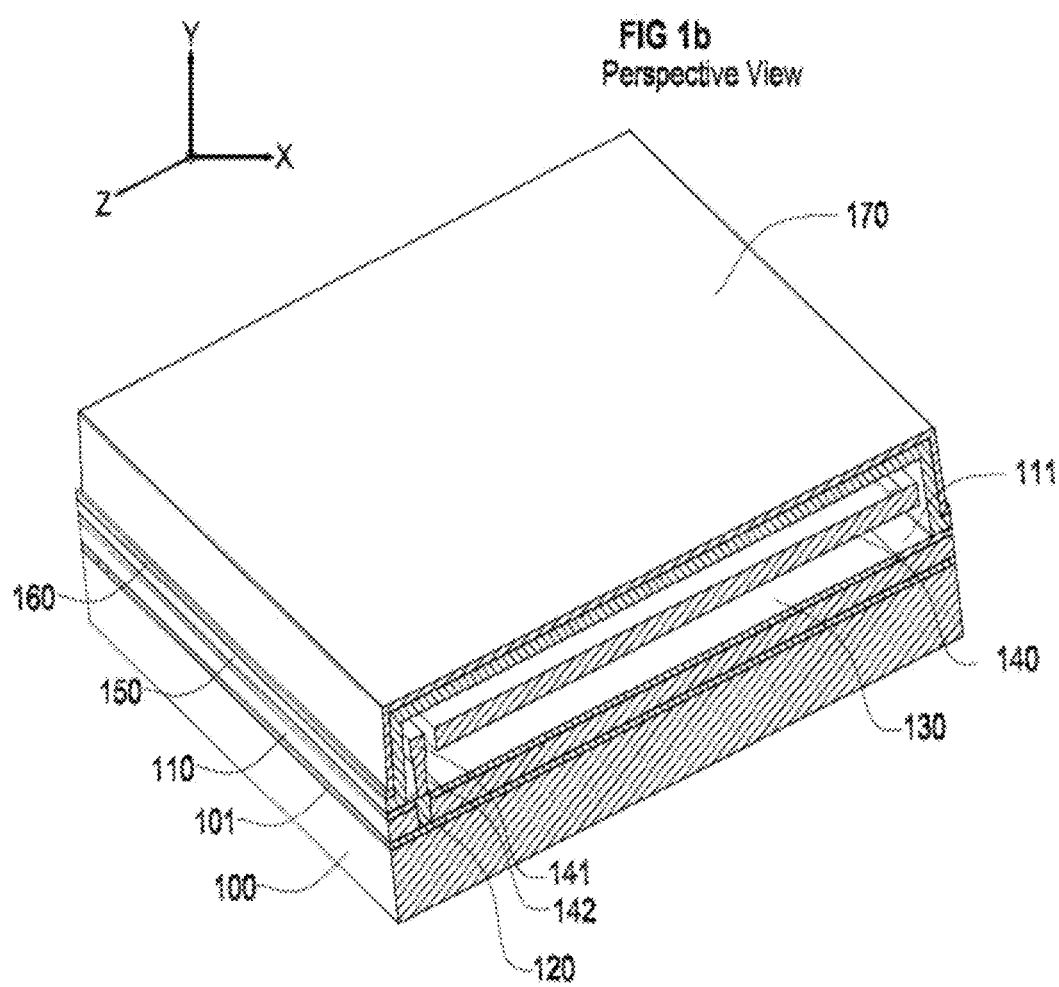

Perspective View

_US 9,029,773 B2_

SEALED INFRARED IMAGERS

RELATED U.S. APPLICATION DATA

Provisional application No. 61/603,812 filed on Feb. 27, 2012.

BACKGROUND

This description relates to design, structure and fabrication of infrared, thermal imaging and sensing devices, also referred to as microbolometers, based on Micro-Electro-Mechanical Systems (MEMS) structures integrated with Complementary Metal Oxide Semiconductor (CMOS) circuits.

MEMS microbolometers are wavelength-independent detectors that sense incident electromagnetic radiation by the temperature increase caused by the radiation's absorption in a sensing element. The sensing element includes a temperature-sensing material whose resistivity is dependent on temperature. The temperature (or rather temperature change) of the element then can be read-out by measuring the resistance of sensing element using associated circuitry. Detectors can be single, or arrayed in a focal plane array (FPA) to form an image Microbolometers are typically optimized to detect infrared wavelengths in the 2-14 μm region where traditional photonic sensors are insensitive (as in the case of silicon-based Charged Coupled Devices or CMOS image sensors) or expensive to fabricate (as in the case of quantum-well devices). They can be implemented in cameras that are useful in applications such as night vision, surveillance/security, medical imaging, energy audits and search and rescue. The single elements or small arrays can be used for non-contact temperature sensing and motion and gesture detection. Vacuum packaging for MEMS microbolometers is extremely important for effective device performance. For the temperature sensing material used in microbolometers, typical temperature coefficients of resistance (TCR) are approximately 2-4%/degree Kelvin. Therefore, for low illumination intensity (or small illumination differentials), changes in the detector temperature and, hence, resistance can be extremely small. Once such differentials in resistance are equivalent to noise levels, sensitivity is lost. For maximum signal to noise performance, device architecture attempts to obtain the greatest temperature rise in the detector for any unit light input; therefore, thermal isolation of the temperature-sensing structure is critical to prevent parasitic heat transfer to the environment. For this reason, a suspended-bridge MEMS structure with narrow supports is often employed to reduce thermal conduction to the substrate and surrounding environment. Furthermore, detectors are often packaged in reduced pressure environments ($<10^{-3}$ mbar) to minimize convective heat transfer to the surrounding gas. Also, since the device performance is so sensitive to the package pressure, device reliability requirements usually specify that the vacuum environment has a hermetic package seal (for example, in accordance with MIL Spec 883) to ensure leak tight performance over device lifetime.

Yield loss due to variation in pixel performance across an array or wafer is a significant contributor to the ultimate cost of microbolometer devices. The response and performance of individual pixel elements is strongly influenced by process variation and non-uniformity during fabrication. For example, non-uniformities in the temperature sensing film properties across a wafer and across the individual die can cause greatly varying device performance. Since a single focal plane array may contain between $10^3$ to $10^6$ pixels and each pixel must operate in a relatively narrow performance window, yield loss because of excessive performance variation is a significant issue that contributes to the cost of these devices.

The above described limitations are addressed with the design, structure and fabrication of novel imaging arrays and sensors described below.

SUMMARY

Architecture, structure and fabrication processes of microdevices that require hermetic sealing are described. The approach is based on monolithic integration of CMOS electrical circuits with sensing, individually sealed MEMS elements. Sealing of sensing elements of the array is performed in controlled environment (low pressure or vacuum) at the individual element level rather than at the die level or wafer level.

The element-level encapsulation and sealing is performed as a final step of microfabrication. Standard wafer level testing and sorting common to CMOS wafers is performed after sealing so that good dies are identified for further back end processing. Furthermore, this method of element-level encapsulation and sealing permits standard back-end processing common to CMOS wafers such dicing, singulation, die attach, wire-bond and encapsulation.

The imaging chip is combined with the processing chip that contains calibration data and performs image processing, analysis and recognition to create a complete imaging solution that is incorporated into infrared cameras.

DETAILED DESCRIPTION

Figure 1A:
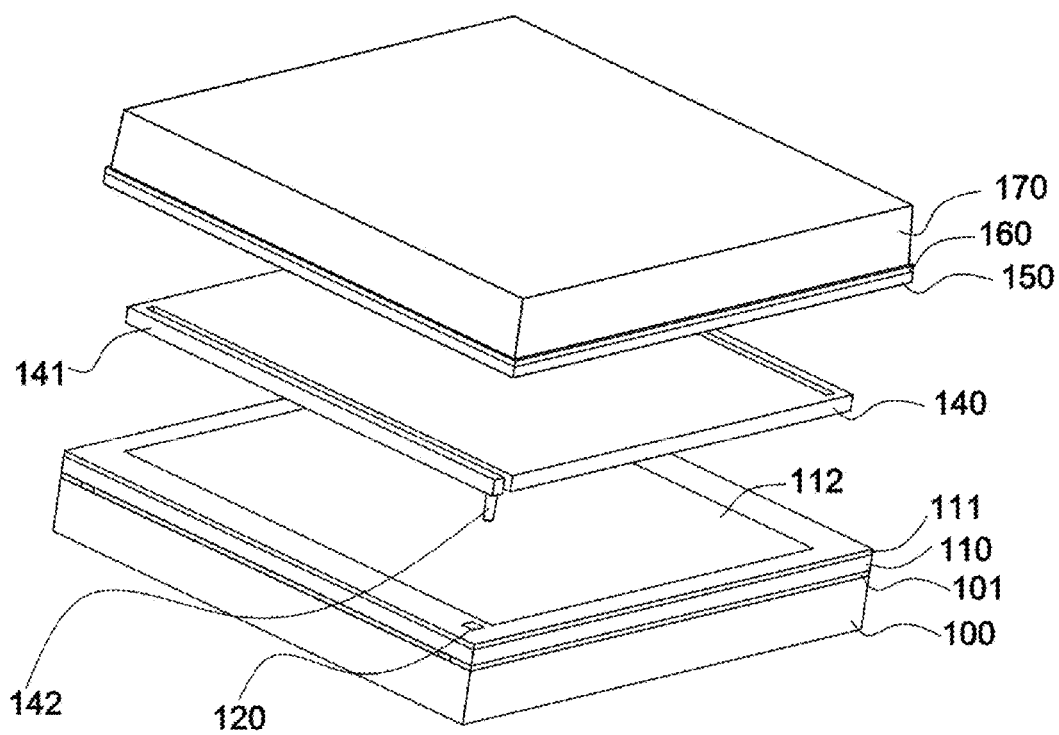
FIGS. 1a and b show schematic architecture of a single element of the device with the seal enclosing an individual element in exploded view and perspective view with cross section, respectively.

The architecture of the individually sealed, electro-mechanical element, being MEMS sensor or actuator, is outlined in FIGS. 1a and 1b. In the case of optical sensors such as an imaging array, the sensing elements in the array must be exposed such that visible or infrared light can illuminate them. It is also preferable to place electronics that drives the sensor and processes sensor signals as close as possible to the sensors to minimize parasitic signals and noise. For this reason, the important parts of electrical circuitry are preferably placed under sensors. The driving and sensing electronics 101 is built on the substrate 100 and the sensing element 140 is then located above sensor electronics 101. The sensing electronics normally built using Complementary Metal Oxide semiconductor (CMOS) technology represents Read Out Integrated Circuit (ROIC) that will be described in more details below. ROIC's are connected to the sensing multilayer 140 with vias 120. The layer 110 is the electrical isolation layer and the layer 111 contains the metal lines and the reflector 112.

An example of the sensing element is infrared sensing structure that changes its electrical resistance due to heating as a result of absorption of infrared radiation. In order to detect small changes in the resistance of this infrared sensing element, its thermal isolation from the surrounding is required. For this reason, the sensing multilayer 140 is generally suspended above a cavity 130 and is sealed at low pressure or vacuum environment. In addition, the sensing multilayer has to have the minimal thermal conduction with the remaining structure but it has to be electrically connected to the sensing circuit. In order to enhance thermal isolation of the sensing layer from the underlying structure, long legs 141 are implemented between the active area of the sensing multilayer and the posts 142 that serve as electrical contacts and mechanical supports. Consequently, the sensing multilayer 140 has two electrical contacts that also serve as mechanical posts or supports for the sensing element. In other cases, more posts with mechanical and electrical functionality can be employed. The sensing multilayer 140 typically includes materials that have large temperature coefficient of resistance. As stated already, the sensor multilayer 140 should be placed in low pressure or vacuum environment which is implemented here by enclosing and sealing each sensing multilayer 140 individually. This approach contrasts with an enclosure that is normally sealed only around the whole array of sensing elements. The preferred embodiment is based on creating a border 150 surrounding each element and on forming cover layer 160 that encloses each sensing multilayer 140 without making mechanical contact with it. The cover layer 160 is supported by sacrificial material during fabrication and this material is removed and the whole cavity is sealed hermetically. The architecture that supports such a structure has one or more holes in the cover layer 160. These holes enable the removal of the sacrificial material before sealing and are subsequently closed hermetically. For this reason, the final layer in the structure is the sealing layer 170 that covers the whole device and seals the holes in the cover layer. For optical sensing, the cover layer 160 and sealing layer 170 have to be also optically transparent.

In case of infrared imaging elements, cover layer 160 and sealing layer 170 have to be transparent at least in infrared part of the spectrum. In order to enhance absorption of light by the sensing element, the layer of absorbing material is included in the sensor multilayer structure 140. In addition, the maximum absorption of infrared illumination can be achieved by placing a good reflector at the bottom of the cavity below the sensing multilayer and adding anti-reflective layer or several layers above the absorption layer. When the optimum absorption structure is preferred, the cavity between the reflector layer 112 and absorbing layer can be built so that it forms Fabry-Perot cavity where the radiation bounces between these two layers until large majority of radiation has been absorbed. When the device is not an optical detector, the structure can be simplified. It can contain only suspended sensing or actuating layer 140 and cover layer 160 plus sealing layer 170.

Figure 2:
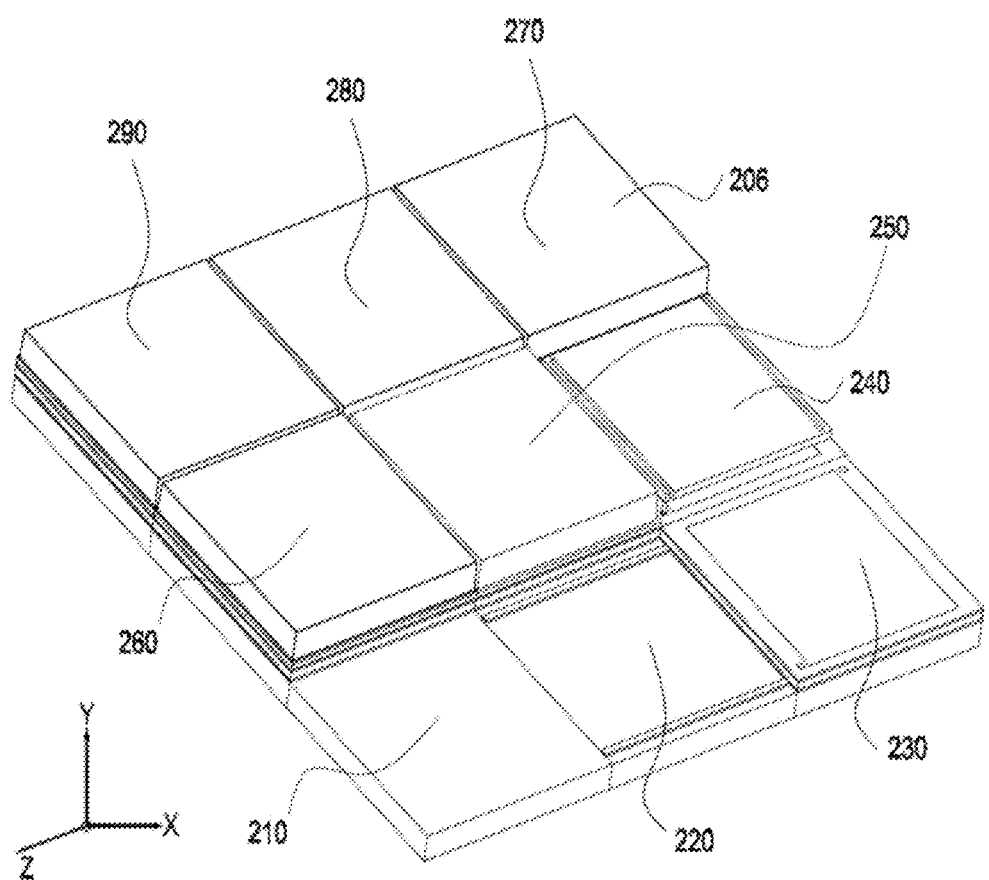
FIG. 2 shows schematically array of elements.

The imaging device is normally created by many elements described in FIGS. 1a and 1b that are arranged in the form of the rectangular or square array as shown schematically in FIG. 2 where the complete elements are labeled as 250 through 290 and the partially completed elements as 210 through 240. The partial element 210 shows only the substrate, the partial element 220 includes additionally ROIC, the partial element 230 includes additionally reflector 112 and vias 120 and the partial element 240 includes additionally the sensing multilayer 140 with the supporting posts 142.

The electrical ROIC normally comprises of x and y addressing matrix that allows electrical contacts to each individual element in the array. The circuit that is associated with each sensing element or with the block of sensing elements (such as columns) is shown schematically in FIG. 3. It consists of variable resistor Rx corresponding to its increase in temperature due to the absorbed energy, the voltage supply 310 and Wheatstone bridge 320 for sensitive detection of the change of the element resistance Rx. The Wheatstone bridge is formed by four resistors, one of which is variable resistor Rx. Three additional resistors R1, R2 and R3 complete the bridge circuit. The voltage supply 310 can be steady state (DC) and then the detection is in DC domain. For more sensitive detection, alternating voltage (AC) is used with the corresponding AC detection.

Figure 3:
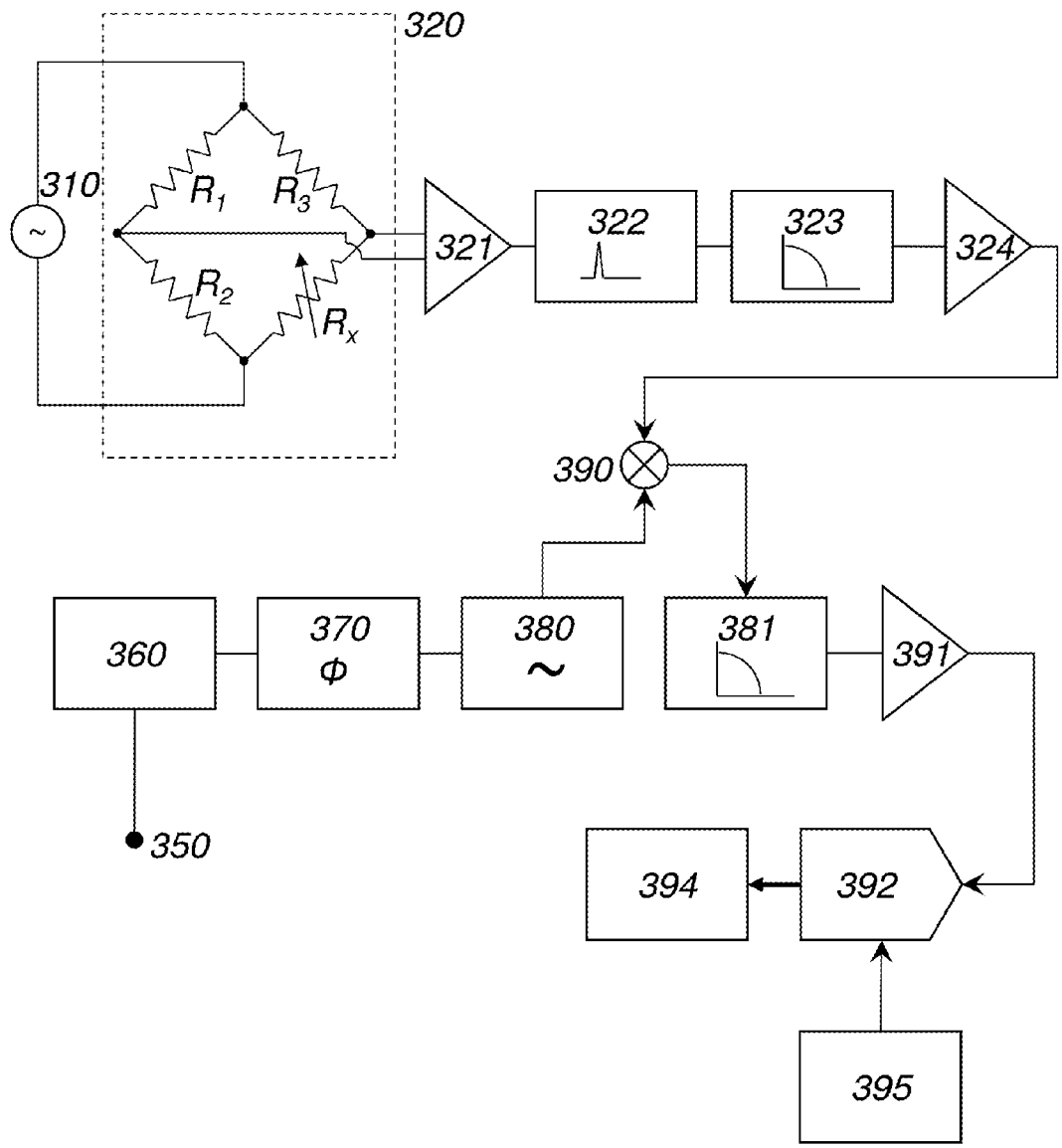
FIG. 3 is a simplified diagram of Read Out Integrated Circuit associated with each element.

In FIG. 3, the simplified diagram of AC Wheatstone bridge with phase lock sensitive detection is presented. Differential input from the bridge 320 is amplified with differential amplifier 321, filtered with notch filter 322 and bandpass filtered with 323 and then amplified further with high gain amplifier 324. The signal from the amplifier 324 is mixed with the reference signal by the mixer 390. The reference input 350 is processed through the phase lock loop 360, phase shifter 370 and sine converter 380 into the mixer 390. The resulting signal from the mixer 390 is filtered with the low pass filter 381, amplified using the AC amplifier 391 and subsequently digitized with analog-to-digital converter (ADC) 392. The voltage reference 395 is provided to the ADC. The digital controller 394 receives the data from ADC 392 and feeds it into the output.

For a less sensitive detection, the electrical circuit can be significantly simplified. It consists of the constant current applied to the sensing element Rx or constant voltage applied to that element, the corresponding single ended or differential voltage or current amplifier 321 respectively and analog-to digital converter 392.

In addition, the implementation of analog to digital conversion of the microbolometer read-out signal at the element level enables other performance improvements. These include autocorrelation circuit to reduce 1/f noise, correlated double sampling to minimize fixed pattern noise, non-linear dynamic range using sampling time as a controllable parameter permitting adequate signals at low signal levels with long integration times and un-saturated signals for elements with high signal levels using short integration times and global shutter using element level dynamic storage capacitor.

Microbolometers require sealing in reliable, vacuum environments to operate effectively. However, hermetic sealing in a controlled environment, or specifically a vacuum environment, is difficult and costly. The conventional approach involves assembling devices in a hermetic chip-scale package (CSP). Such chip-scale packages are very costly since they are fabricated from metal or ceramics with engineered optical windows and substrates and have multiple layers of metallization to feedthrough Input/Output signals across the seal. Material cost alone can be 2-3 times the cost of the bare die. Furthermore, device test and sort cannot be done before packaging since the device requires a vacuum environment to operate correctly. The implication is that fabricated devices cannot be tested and sorted prior to assembly into the aforementioned expensive CSPs; therefore, production costs are high because even bad dies are assembled. Dicing and singulation of die poses further difficulties since the typical wafer saw process cannot be done on wafers with exposed MEMS devices because the water used for blade cooling would destroy the devices. Therefore expensive and exotic singulation process must be used such as laser dicing, scribe and cleave, or post-singulation release.

Wafer-level packaging (WLP) improves upon the cost and complexity of a chip-scale package, but still requires steps that increase fabrication costs. Hermetic WLP requires specific sealing materials that often need large sealing zones which increase die size. Sealed wafers are often expensive and highly engineered, usually including patterned cavities, optical windows, anti-reflective coatings, and black apertures. The packaging process includes wafer bonding at elevated temperatures and is prone to yield loss due to seal failure. While wafer-level test and sort is possible, it usually requires a complex dicing process to expose the bond-pads. Finally, while traditional wafer sawing is possible after the devices are protected by the sealing wafer, the sawing must pass through two wafers which requires thicker saw blades, multiple dicing passes and larger kerf zones. Existing packaging approaches, while getting better, leave opportunity for improvement and reduction in cost.

While traditional packaging encapsulates devices after "front-end" micro-fabrication is complete, Element Level Encapsulation (ELE) seals the device in a vacuum or controlled atmosphere as the last step of the micro-fabrication process. The preferred embodiment is based on creating the border 150 surrounding each element and on forming cover layer 160 that encloses each element without making mechanical contact with it.

The process includes the formation of a cover layer suspended shell-like structure 160 over each individual active element using thin-film deposition which seals around the periphery of the device and forms an encapsulated, controlled vacuum environment around each element. This approach contrasts with an enclosure that is normally sealed only around the whole array of sensing elements. The general sequence of fabrication steps is outlined in FIG. 4. In short, the process includes the deposition of a sacrificial material over the sensing multilayer 140 and patterning of the sacrificial material to form a trench around the device periphery in step 420, deposition of the cover layer over the sacrificial film and into the trenches and patterning of small openings into the cover layer 160 in step 425, removal of the sacrificial material through openings in the cover layer in step 430, and finally hermetic sealing of the openings with subsequent deposition of sealing layer 170 in step 435. The encapsulated environment is essentially that of the process chamber environment during the final stage of deposition of sealing film. In plasma-enhanced chemical vapor deposition (PECVD), the pressure is typically 10's to 100's of milliTorr with carrier and precursor gas species and this pressure and gas composition can be suitably adjusted. In physical vapor deposition (PVD) such as electron beam deposition or thermal evaporation, lower pressures can be attained, down to microToors. In any of the deposition methods, gas species and the pressure can be suitably adjusted just prior to sealing of the openings to trap the desired environment.

Figure 5:
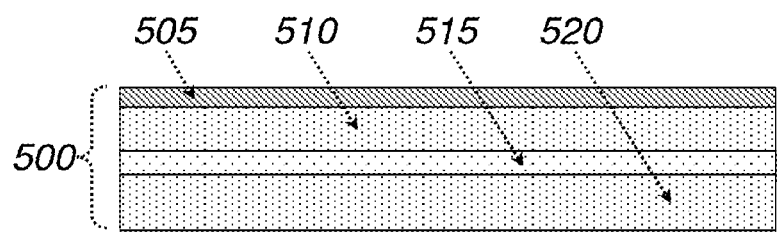
FIG. 5 is a diagram illustrating the cross-section of the film-stack used in the fabrication of the microbolometer sensing element in accordance with one embodiment of the present invention.
Figure 6:
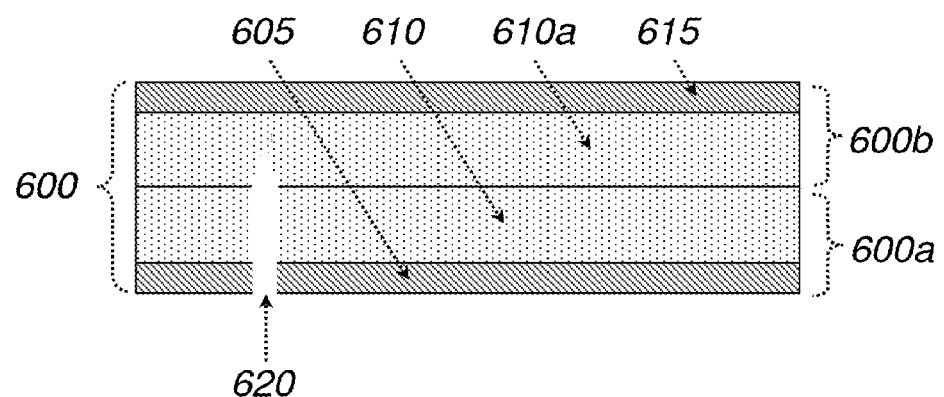
FIG. 6 is a diagram illustrating the cross-section of the film-stack used in the fabrication of the encapsulating shell in accordance with one embodiment of the present invention.

The cross section of the sensing multilayer 500 is shown in FIG. 5, the cross section of encapsulation multilayer 600 is shown in FIG. 6, and the cross sectional drawings of the fabrication steps of invention is shown in FIGS. 7a to 7h. The sensing multilayer 500 is typically composed of the temperature sensing layer 515 that is surrounded by the anti-reflective layer 505 and the absorbing layer 510 on the top and anti-reflective layer 520 on the bottom. The encapsulation multilayer usually consists of anti-reflective films 605 and 615 on top and bottom of the cover layer 610 and the sealing layer 610a. The features 620 correspond to the small openings in the layer 605 and the cover layer 610. They permit the removal of sacrificial materials and are partially closed when the sealing layer 610a is deposited.

Figure 4:
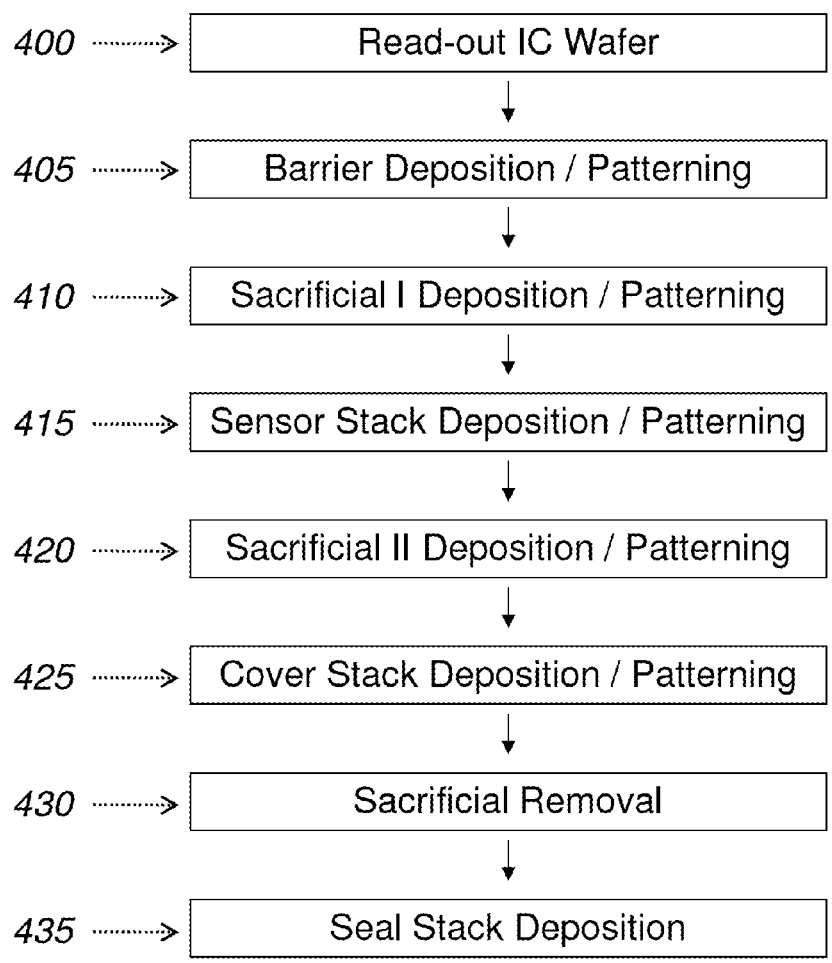
FIG. 4 is a flowchart illustrating the fabrication of a microbolometer with Element Level Encapsulation in accordance with one embodiment of the present invention.
Figure 7A:
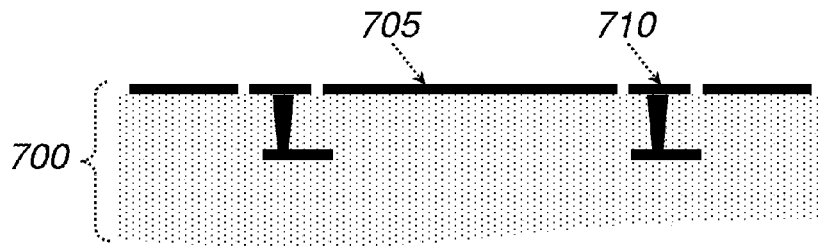
FIG. 7a through 7h are cross-sectional diagrams illustrating in greater detail the steps and structures involved in fabrication of a microbolometer with Element Level Encapsulation in accordance with one embodiment of the present invention.

The fabrication process starts with Read Out Integrated Circuit (ROIC) 400 in FIG. 4. A ROIC wafer 700 in FIG. 7a is designed and fabricated with standard CMOS technology. It is noted, however, in this example of the invention, that the ROIC is processed only to the top-most metal layer 705 and 710 and does not have a passivation layer that is typical for finished CMOS wafers. In the microbolometer focal plane array (FPA) area, the top metal pattern includes a reflector 705 and read-out terminals 710 for each pixel. The reflector acts to redirect incident radiation (in this example, mid and long wavelength infrared light) that has not been absorbed by the sensing detection layers back to the detector for absorption. Secondly, it shields the detector from extraneous heat sources such as the heat generated in the ROIC itself, for example. The read-out terminals interface with the microbolometer MEMS structure allowing the biasing and read-out of the detector's resistance.

Figure 7B:
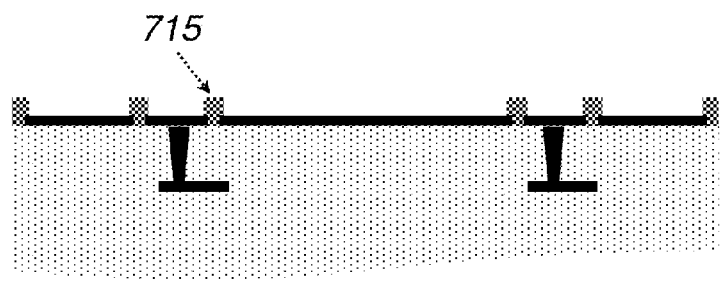

In one embodiment, a Vapor Hydrofluoric (VHF) or liquid hydrofluoric acid with critical point drying process is employed to remove an oxide sacrificial film used to form the MEMS structure. However, many other types of sacrificial films (such as photoresist, carbon or germanium) and, therefore, other release processes (ashing with oxygen or hydrogen peroxide etch) may be used. In the case of the VHF release of an oxide sacrificial material, a barrier film 715 in FIG. 7b is deposited and patterned in a subsequent process step in such a way that it covers only the gaps between metal lines. This barrier film and the top metal material are selected so that they are resistant to VHF etching, and therefore protect the underlying layers from attack. This barrier film must be resistant to VHF, non-conductive, and highly conformal. In one example of such a barrier film, ALD (atomic layer deposition) aluminum oxide is used. Other ALD barrier films such as hafnium oxide or zirconium oxide can be alternatively used.

Figure 7C:
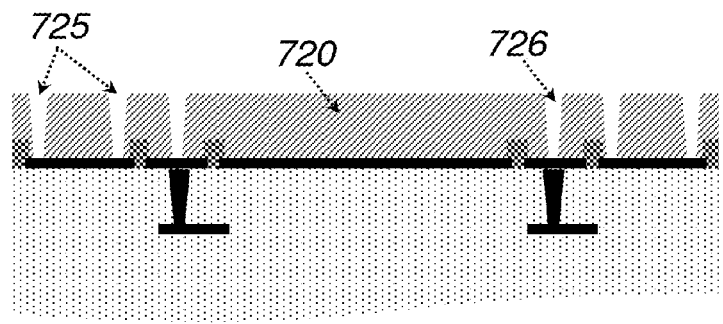
Figure 7D:
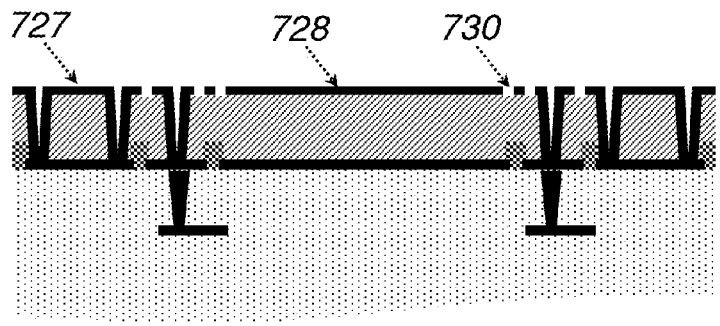

In a subsequent process step 410 in FIG. 4, a sacrificial material 720 in FIG. 7c is deposited and patterned in regions 725 and 726 over the top metal and barrier layers. In a preferred embodiment, the sacrificial film is PECVD oxide. The patterns include trenches 725 that circumscribe the periphery of the element and via holes 726 which form the support posts and electrical interconnect of the microbolometer sensor stack.

In a subsequent process step 415, the sensor multilayer 500 in FIG. 5 is deposited over the sacrificial layer and into the trenches 725 and via holes 726 in FIG. 7c. Deposition into the via holes simultaneously forms the support posts for the suspended-bridge microbolometer structure and the electrical interconnects to it. Deposition into the trenches 725 forms a raised seal ring 727 around the microbolometer structure. Patterning of the deposited film defines the legs 730 of the microbolometer structure and isolates the microbolometer from the cover ring. In one embodiment, the sensor multilayer 500 in FIG. 5 includes a thin metal reflector/absorber 505, a top anti-reflection layer 510, a temperature-sensing layer 515, and a bottom anti-reflection layer 520. The temperature-sensing layer must make electrical contact to the top CMOS metal through the vias; therefore, the bottom anti-reflection layer 520 must be cleared from the vias. Furthermore, the temperature-sensing layer 515 deposition must have sufficient step coverage to provide proper mechanical support and electrical connection to the microbolometer.

Figure 7E:
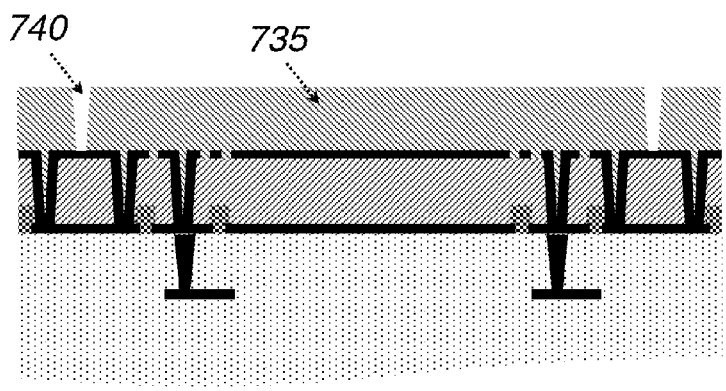

In a subsequent process step 420 in FIG. 4, a second sacrificial layer 735 in FIG. 7e is deposited and patterned in regions 740 over the sensor stack. In a preferred embodiment, the sacrificial film is PECVD oxide, even though other materials such as amorphous carbon can be used. The patterning includes a trench 740 that circumscribes the periphery of the pixel and lands on the raised sealing ring 727.

Figure 7F:
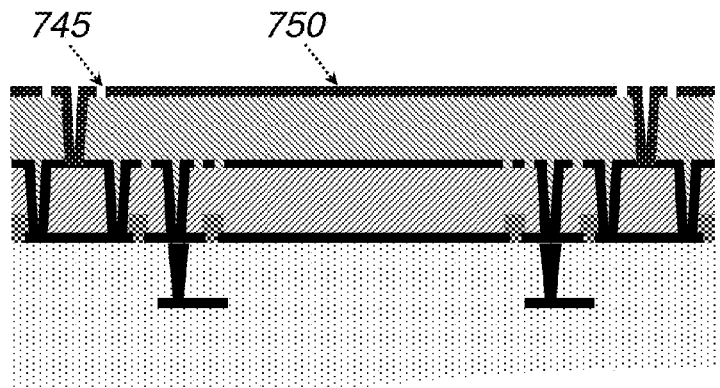
Figure 7G:
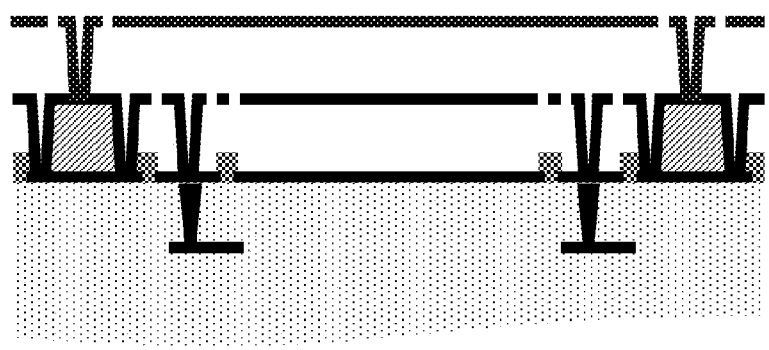
Figure 7H:
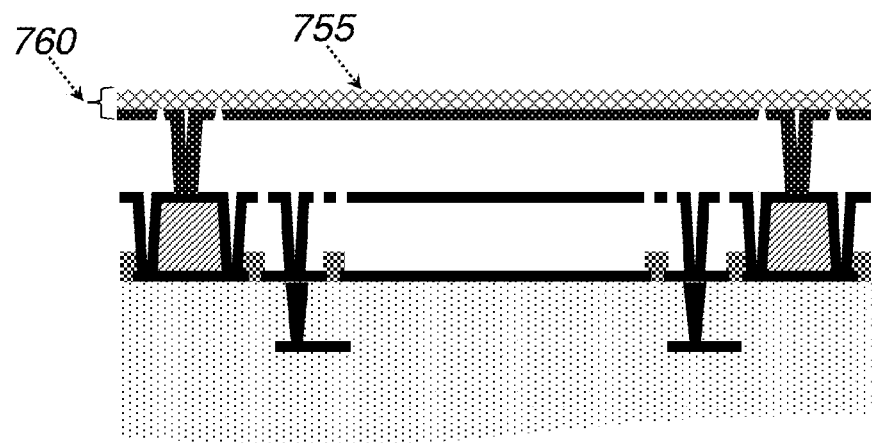

In a subsequent process step 425 in FIG. 4, a cover layer 600a in FIG. 6 is deposited over the sacrificial layer and into the trenches 740 in FIG. 7f. Deposition into the trenches forms the supporting walls that seal the resulting cover structure to the sealing ring. In one example of the cover stack, a first layer of silicon-nitride is deposited as an anti-reflection layer followed by a second layer of CVD amorphous silicon. The thicknesses of the respective layers are adjusted to generate λ/2 (wavelength of light divided by 2) phase shift between reflections at each interface. For a simple single-layer anti-reflective coating, the layer's refractive index (RI) should be approximately the average between the RI for air (1.0 at 10 um wavelength) and the RI for the amorphous silicon cover material (3.4 at 10 um wavelength) or 2.2. Silicon-nitride can be readily deposited with approximately such a RI.

Another consideration is that all films in the cover layer stack should have relatively low absorption at the wavelength of interest to prevent loss of incident radiation intensity. In case of infrared imaging elements, the cover layer and sealing layer must have low absorption in infrared part of the spectrum. They can be formed using undoped germanium, silicon, silicon germanium or other films. Although both silicon nitride and silicon absorb long wavelength (3-14 um) infrared radiation moderately, total absorption is exponential with the thickness of the absorbing layer. In this invention, the thickness of the encapsulating stack 600 in FIG. 6 needs only be sufficient to mechanically support the approximately 1 atmosphere pressure differential across the device size between internal cavity and the outside environment. For a 40 um×40 um and 10 um×10 um devices, only 2 um and 0.5 um, respectively of encapsulating stack thickness is needed, resulting in almost no absorption. This is in contrast to approximately 500 um thickness needed for wafer-level packaging windows.

In one embodiment of the invention, a small opening or a plurality of openings 745 in FIG. 7f are patterned into the cover layer which provide access to the underlying sacrificial layers during the subsequent release process. Such openings are patterned to the small size with a favorable dimension less than 0.5 um. The opening size must be large enough such that adequate access to the sacrificial material is provided for etchants and reaction products to pass across the cover layer while being small enough to be easily sealed in a subsequent deposition step. In an alternative embodiment, the cover layer 600a in FIG. 6 consists of porous films which allow the transfer of gases through the film. With access to the sacrificial layers, the release process 430 in FIG. 4 is applied to selectively and isotropically etch the sacrificial layers through the openings or pores. In a one embodiment, VHF is used to etch the sacrificial oxide layers. The sensor stack 500 in FIG. 5 and cover stack 600 materials in FIG. 6 must be carefully chosen to ensure they are not attacked by the release process. Furthermore, as stated previously, a barrier layer 715 in FIG. 7b must be applied to prevent attack of underlying layers in the CMOS wafer by the release process.

The preferred materials for the sensing layer are doped amorphous silicon, germanium and silicon-germanium alloys. These materials can be deposited at temperatures near or below 400 deg C., which are compatible with CMOS circuitry. At these processing temperatures, CMOS performance does not degrade.

For the cover and sealing materials, amorphous silicon, germanium, silicon-germanium alloys and chalcogenides are the suitable materials.

When sealing a small volume in vacuum as described herein, the high vacuum level may be degraded by the transport of a relatively small amount of gas into the sealed cavity. Sources of such gas may be outgassing from the CMOS substrate or other films used in constructing the cavity. Alternatively, gas diffusion across the sealing films may occur particularly with the driving force resulting from the pressure differential between the cavity and the external atmosphere. To minimize these effects, a thin, conformal film with low gas permeability can be deposited through the openings 745 uniformly coating the interior of the cavity on all exposed surfaces. In addition to being low-permeability and highly conformal, this film must be non-conductive to prevent shorting of the microbolometer element. Furthermore, the film must be thin and optically transparent in the wavelength of interest to prevent alteration of the optically active surfaces (such as anti-reflective coatings and the Fabry-Perot structure). In a preferable embodiment, it is ALD film with a thickness between 50 A and 1000 A.

Alternatively, the getter film can be included and patterned, if desired after the layer 705 is defined.

In a subsequent process step 435 in FIG. 4, a sealing layer 600b in FIG. 6 is deposited over the cover layer 600a using PECVD or PVD processes. In one embodiment, the sealing stack includes a first layer of amorphous silicon followed by a second layer of silicon nitride to achieve anti-reflection condition. PECVD deposition process is favored because of its unique attribute of "bread-loafing" which allows the deposited film to bridge across narrow gaps when the film thickness is larger than the gap. This effect is a result of higher deposition rates at the corners of structures due to the larger angle of acceptance of incident reactants. With the thickness of the sealing stack much greater than the opening 745 in FIG. 7f in the cover stack, the opening can be sealed under the same pressure and atmosphere as the deposition chamber at the time of closure. In another embodiment, physical vapor deposition (PVD) is used to deposit the sealing stack. PVD deposition is preferable for sealing in some cases because the pressure of the deposition process, and therefore the pressure sealed in the cavity, is typically lower than that of Chemical Vapor Deposition (CVD)-based sealing processes. Also, the sealing gas species in PVD processes is typically only argon while CVD gas species may contain many different precursors and product gases. In the specific example of sealing a microbolometer device, PVD amorphous silicon is used as the sealing film in one embodiment of the invention. Since sealing occurs only when the film thickness reaches approximately one-half of the opening width, some of the deposited film will pass through the opening and appear on the structures in the cavity under the opening. Therefore, it is advantageous to position the openings over non-critical areas of the device. In an alternative embodiment where a porous film is used for the cap stack, the pore-size or the pore pathway can be fabricated such that no deposition will occur within the cavity while still permitting evacuation of the cavity.

Figure 8:
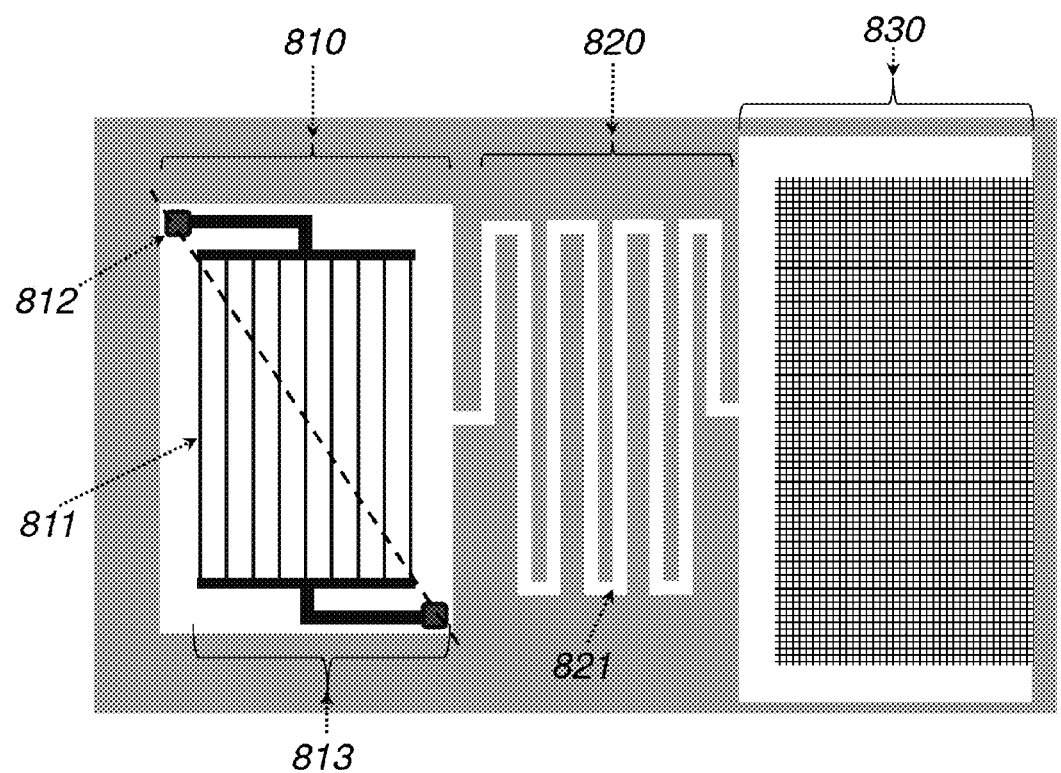
FIG. 8 is a diagram illustrating the top-down view of the getter device structure used for maintaining a vacuum environment in the device cavity according to one embodiment of the invention.

As previously mentioned, sealing small cavity volumes as described herein is problematic since the internal environment can be significantly altered by the leak of relatively small amounts of gas into the cavity from outgassing or diffusion across the encapsulating films. This is particularly an issue in cavities with sealed vacuum since the pressure differential provides a driving force for leakage. In the case of sealed vacuum cavities, it is advantageous to integrate getter material to adsorb or pump gas that may leak into the cavity. Integrating getter material into the device at the wafer-level can be difficult since getter materials are often incompatible with device fabrication processes. Furthermore, activation of getters can require high temperatures and simultaneous sealing and activation in vacuum. Therefore, it is useful to have an integrated getter that can be formed with processes compatible with standard CMOS processing that can be activated in a convenient, low-cost manner. In one embodiment of such a solution a getter device FIG. 8, one or a plurality of getter cavities 810 are formed separately but proximal to one or a plurality of cavities containing the device. In the case of an array of microbolometers, one or several getter devices may be connected to the array or each row or column individually. This getter cavity is fabricated and sealed using the same processes for element-level seal described previously. At the bottom of the cavity, a series of "fuse-like" structures 813 are fabricated using standard metal patterning techniques. In a preferred embodiment, these fuse-like structures are fabricated from the top metal layer of the CMOS readout or control circuitry. Furthermore, the fuse structure consists of a series of narrow metal lines run in parallel 811 interconnected by two vias 812 which are in turn interconnected to two bondpads or test pads. In one embodiment, the metal lines 812 contain titanium metal or other material which, when heated, becomes reactive to certain gas species that may be present in the cavity. The getter device is activated by applying voltage across the pads connected to the vias 812 such that the metal lines 811 are heated resistively. Ultimately, the metal lines will melt, evaporating and sputtering the activated material throughout the getter cavity 810 providing a pumping action on the gasses in the cavity. This getter cavity 810 is connected to the device cavity 830 through a tortuous pumping channel 820. The tortuous design of the pumping channel provides a pathway to evacuate gasses from the device cavity while preventing the evaporated and sputtered metal from impacting the device. The pumping channel is fabricated and sealed using the same processes for element-level seal described previously. The die can be designed with a plurality of getter devices that can all be activated initially upon completion of fabrication of activated sequentially across the device lifetime to maintain vacuum levels as the device seal leaks. The preferred getter materials are titanium, tantalum and their various alloys. The schematic diagram in FIG. 8 does not represent the relative sizes of the getter area 810, pumping channel area 820 and the imaging array 830. The size of the getter and pumping channel is typically very small compared to the size of imaging array 830.

Alternative way of including the getters that require activation is to have one area or distributed areas in individual sealed elements that are activated by exposure to the strong laser light that is not attenuated strongly by the cover and seal layers, such as carbon dioxide laser that emits at 10.6 um. Carbon dioxide laser can be scanned over the whole wafer in order to activate getter areas selectively by heating the getter material to temperatures that can reach evaporation temperatures.

After sealing, the resulting device is a completed, fully protected MEMS/CMOS device that can undergo normal back-end processing such as wafer dicing, die attach, and wire-bonding without additional protection. It is recognized and apparent, that the above description is not comprehensive of all the steps and details required for the fabrication of a microbolometer device; however, it does provide to one skilled in the art sufficient detail to replicate the invention disclosed herein.

Traditionally, MEMS devices are integrated with control/readout circuitry using package-level integration (ie wirebonding, flip-chip, or Through Silicon Vias) primarily because CMOS devices used for readout/control cannot survive the high-temperature processing common in some MEMS process flows. With the advent of new lower-temperature MEMS process flows, monolithic CMOS and MEMS integration became possible. Monolithic CMOS and MEMS integration provides several important advantages over package-level integration such as superior signal integrity (lower parasitic capacitance and resistance) between MEMS structures and control/readout circuitry, minimized chip footprint, and the absence of complex package-level interconnect. Indeed, many advanced arrayed MEMS devices can only be fabricated in a monolithic fashion because of the high signal integrity or data rates needed to operate them. In the microbolometer case, extremely high signal integrity is required to accurately detect small changes in resistance when reading microbolometer element. In one embodiment of this invention, the microbolometer device is monolithically integrated with ROIC electronics.

Figure 9:
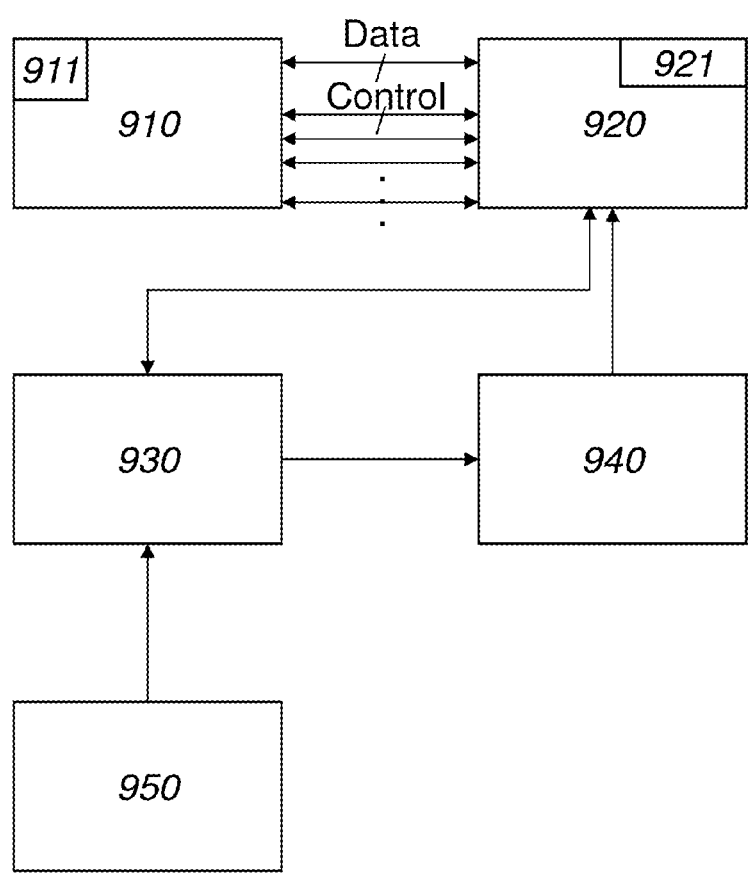
FIG. 9 shows the part of the system architecture including the sensing imaging array, image processor and image recognition for infrared imaging camera.

The simplified electronic system block diagram is outlined in FIG. 9. It consists of the sensor chip 910 described above, Application Specific Integrated Circuit (ASIC) 920, microprocessor 930, display 940 and interfaces to the camera controls and components 950. Temperature sensor 911 is included on the sensor chip 910 to correct for the sensitivity differences arising from variation of the global temperature of the sensor array being caused by variation of the ambient temperature and exposure to the infrared light.

ASIC includes non-volatile memory 921 to store the data locating non-functional elements and data representing sensitivity of each element of the array 910. Such data is used to interpolate between non-functional pixel elements and correct for changes in the sensitivity of the elements in the array. In an alternative embodiment, the non-volatile memory is fabricated as a part of the sensor chip 910. Furthermore, the memory may be fabricated within each pixel.

The sensing system is completed with firmware and software having algorithms for image analysis and image recognition embedded in digital signal processor 930. The visible camera array can be combined with the infrared imaging subsystem. The combined visible and infrared acquisition at the same time permits use of data from visible image to correct and improve infrared image and vice versa. The electronic system described above is the key part of the infrared camera which included optical subsystem, mechanical components and other electrical control and communication hardware and firmware.

Those skilled in the art will recognize that designs and processes described above can be applied to a multitude of devices that require hermetic sealing in a controlled, specifically vacuum, environment, not only infrared imagers or sensors. Furthermore, this invention enables fabrication of devices that require controlled environments with no additional packaging steps after micro-fabrication. This allows these MEMS devices to leverage the enormous standard CMOS infrastructure for wafer test, sort, dicing and assembly.

What is claimed is:

1. A suspended, individually sealed element with sensing multilayer that includes infrared light absorbing, temperature sensing and antireflective layers for detection of intensity of infrared radiation, integrated monolithically with readout integrated circuit underneath.

2. The element of claim 1 with optically transparent cover and sealing layers.

3. Read out integrated circuit located below the suspended element of claim 1 by monolithic integration with such element.

4. Getter layers enclosed within each cavity of elements or adjacent to the array of elements in claim 1.

5. The doped amorphous silicon or doped silicon-germanium temperature sensing materials of the elements of claim 1.

6. One or two dimensional arrays of infrared light sensing elements of claim 1.

7. An infrared camera system consisting of array of elements of claim 1, control electronics and digital image processing electronics.

8. The system of infrared arrays of claim 1 and visible sensing arrays with the signal processing using visible imaging data to improve infrared image and infrared imaging data to improve visible image.

* * * * *